(12) United States Patent
Tada et al.

(10) Patent No.: US 7,531,832 B2
(45) Date of Patent: May 12, 2009

(54) LIGHT-EMITTING TRANSISTOR

(75) Inventors: Hirokazu Tada, Okazaki (JP); Tomo Sakanoue, Okazaki (JP)

(73) Assignee: Japan Science and Technology Agency, Kawaguchi (JP)

( * ) Notice: Subject to any disclaimer, the term of this patent is extended or adjusted under 35 U.S.C. 154(b) by 0 days.

(21) Appl. No.: 10/589,359

(22) PCT Filed: Feb. 14, 2005

(86) PCT No.: PCT/JP2005/002162

§ 371 (c)(1),
(2), (4) Date: Aug. 14, 2006

(87) PCT Pub. No.: WO2005/079119

PCT Pub. Date: Aug. 25, 2005

(65) Prior Publication Data

US 2007/0187665 A1      Aug. 16, 2007

(30) Foreign Application Priority Data

Feb. 16, 2004    (JP)    ............. 2004-038951

(51) Int. Cl.
*H01L 35/24* (2006.01)
(52) U.S. Cl. ................. 257/40; 257/E25.008
(58) Field of Classification Search ........... 257/40, 257/23–24, 17, 79; 438/99
See application file for complete search history.

(56) References Cited

U.S. PATENT DOCUMENTS 5,321,716 A    6/1994    Kinoshita et al.
5,367,195 A    11/1994    DiGiacomo et al.

(Continued)

FOREIGN PATENT DOCUMENTS

JP    A 05-167195    7/1993

(Continued)

OTHER PUBLICATIONS

Hepp, Aline et al., "Light-Emitting Field-Effect Transistor Based on a Tetracene Thin Film," Physical Review Letters, vol. 91, No. 15, 157406-1 to 157406-4 pp, Oct. 10, 2003.

(Continued)

*Primary Examiner*—Wai-Sing Louie
(74) *Attorney, Agent, or Firm*—Oliff & Berridge, PLC

(57) ABSTRACT

The present invention intends to provide a light-emitting transistor (LEFET), a light-emitting device with a switching function, which can produce an adequately strong emission of light with higher emission efficiency. The drain electrode 25 is made of aluminum and the source electrode 24 is made of gold. When a voltage is applied between the source electrode 24 and the drain electrode 25, the source electrodes 24 and the drain electrodes 25 inject positive holes and electrons into the light-emitter layer 26, respectively. The positive holes and the electrons recombine, whereby the light-emitter layer 26 generates light. The on/off state of the emission can be controlled by switching the gate voltage on and off. In contrast to conventional LEFETs in which the drain electrode is also made of gold, the present invention uses aluminum, whose work function is lower than that of gold, whereby a larger number of electrons is injected into the light-emitter layer 26 at a lower voltage. Therefore, both the emission strength and the emission efficiency are improved.

20 Claims, 6 Drawing Sheets

U.S. PATENT DOCUMENTS

| | | | |
|---|---|---|---|
| 5,420,073 A | 5/1995 | DiGiacomo et al. | |
| 6,284,393 B1 | 9/2001 | Hosokawa et al. | |
| 6,740,900 B2 * | 5/2004 | Hirai | 257/40 |
| 6,828,583 B2 * | 12/2004 | Heeger et al. | 257/40 |
| 6,845,114 B2 * | 1/2005 | Patton et al. | 372/39 |
| 7,056,446 B2 * | 6/2006 | Nagase et al. | 216/57 |
| 7,253,433 B2 * | 8/2007 | Ishida et al. | 257/40 |
| 2006/0043380 A1 * | 3/2006 | Hiroshi et al. | 257/79 |
| 2006/0208251 A1 * | 9/2006 | Yoshizawa | 257/40 |

FOREIGN PATENT DOCUMENTS

| | | |
|---|---|---|
| JP | A 06-283622 | 10/1994 |
| JP | A 10-162959 | 6/1998 |
| JP | A 10-294182 | 11/1998 |
| JP | A 2000-133464 | 5/2000 |
| JP | A 2001-189527 | 7/2001 |
| JP | A 2003-258265 | 9/2003 |
| JP | A 2003-282884 | 10/2003 |

OTHER PUBLICATIONS

Yahiro, Masayuki et al., "Electrical and optical characterization of organic field effect transistor using self-organized layered perovskite thin film," Tech. Report of IEICE OME2002-54, The Inst. of Elec., Info. and Comm. Eng., 37-41 pp, Sep. 2002.

* cited by examiner (a)

(b)

(a)

(b)

LIGHT-EMITTING TRANSISTOR

TECHNICAL FIELD

The present invention relates to a light-emitting transistor capable of functioning as a field effect transistor (FET) and a light-emitting device, and it also relates to a laser light source using the light-emitting transistor.

BACKGROUND ART

One of the practical examples of light-emitting devices used in displays or other devices is an organic light-emitting diode (OLED) using an organic substance in its light-emitter layer. Use of the OLED enables display devices to be produced by an ink-jet method or other simple processes, to be large yet flexible, and to be higher in brightness and lower in power consumption than liquid crystal displays.

An example of the switching device for controlling the OLED in the display device is an organic field effect transistor (OFET) with an organic substance used in its channel layer. However, producing a display device having the OFET combined with the OLED requires a complicated production process.

Accordingly, recent studies have focused on the light-emitting field effect transistor (LEFET), a device that functions as both the OLED and the OFET. The LEFET, which emits light by itself, allows the on/off state of the emission to be controlled by turning the gate voltage on and off. Use of such a device in display devices makes it possible to generate and control a ray of light with a single device, thereby eliminating the necessity of combining two devices, i.e. the OLED and the OFET. Thus, it is possible to adopt a simpler process to produce a display device having a simpler structure at a lower production cost. Furthermore, the device can be arranged with a higher density so as to improve the resolution of images.

Non-Patent Documents 1 and 2 each disclose an example of the LEFET. The LEFET disclosed in the aforementioned documents is illustrated in the sectional views in FIG. 1. A gate electrode 11 is covered with an insulating film 12, on which a first source/drain electrode 14 and a second source/drain electrode 15 are provided. The first source/drain electrode 14 and the second source/drain electrode 15 are made of gold in both the Non-Patent Documents 1 and 2. The LEFET in Non-Patent Document 2 has adhesive layers 131 and 132 made of chromium, each of which is inserted between the insulating film 12 and each of the first source/drain electrode 14 and the second source/drain electrode 15 in order to adhere these electrodes onto the insulating film 12. A light-emitter layer 16 made of an organic substance is provided on the insulating film 12, where the layer is in contact with the first source/drain electrode 14 and the second source/drain electrode 15. The light-emitter layer 16 of the LEFET is made of $(C_6H_5C_2H_4NH_3)_2PbI_4$, a PbI-based lamellar perovskite compound in Non-Patent Document 1, and is made of tetracene in Non-Patent Document 2.

[Non-Patent Document 1] Masayuki YAHIRO, et al. "Soujou Perobusukaito Jiko-soshikika-maku Wo Mochiita Yuuki FET No Hakkou Oyobi Denki-tokusei (Electrical and optical characterization of organic filed effect transistor using self-organized layered perovskite thin film)", *Technical Report of IEICE*, The Institute of Electronics, Information and Communication Engineers, OME2002-54, pp. 37-41 (2002)

[Non-Patent Document 2] A. Hepp et al., "Light-Emitting Field-Effect Transistor Based on a Tetracene Thin Film", *Physical Review Letters*, The American Physical Society, vol. 91, No. 15, pp. 157406-1-157406-4, Oct. 10, 2003

This LEFET operates as follows:

The first case assumes that a negative gate voltage $V_G$ is applied to the gate electrode 11, as shown in FIG. 1(a). A source-drain voltage $V_{SD}$ is applied between the first source/drain electrode 14 and the second source/drain electrode 15, with the second source/drain electrode 15 being positive. The source-drain voltage $V_{SD}$ is within the range from several tens of volts to one hundred and several tens of volts; this range is higher than voltages applied to normal FETs. Applying the voltage $V_{SD}$ causes the second source/drain electrode 15 to inject positive holes into the light-emitter layer 16. Then, these positive holes are transported toward the first source/drain voltage 14, being pulled onto the insulating film 12 due to the gate voltage $V_G$. Thus, in the present case, the second source/drain electrode 15 serves as the source electrode and the first source/drain electrode 14 serves as the drain electrode. Meanwhile, the first source/drain electrode 14 injects electrons into the light-emitter layer 16. The number of the electrons hereby injected is smaller than that of the positive holes injected from the second source/drain electrode 15. To secure a sufficient amount of electrons, the voltage $V_{SD}$ is set at a high level, as explained earlier. The positive holes and the electrons thus injected recombine within the light-emitter layer 16 in the vicinity of the first source/drain electrode 14. Thus, the light emitter generates light. Turning the gate voltage $V_G$ on/off leads to an increase/decrease in the concentration of the positive holes in the vicinity of the insulating film 12. Thus, it is possible to control the on/off state of the recombination of the positive holes and the electrons, or the on/off state of the emission.

The second case assumes that a positive voltage $V_G$ is applied to the gate electrode 11, as shown in FIG. 1(b). As in the previous case, the source-drain voltage $V_{SD}$ within the range from several tens of volts to one hundred and several tens of volts is applied, with the second source/drain electrode 15 being positive. This setting makes electrons to be injected from the first source/drain electrode 14 into the light-emitter layer 16. The electrons are then transported toward the second source/drain electrode 15, being pulled onto the insulating film 12 due to the gate voltage $V_G$. Thus, in the present case, the first source/drain electrode 14 serves as the source electrode and the second source/drain electrode 15 serves as the drain electrode. Meanwhile, the second source/drain electrode 15 injects a small number of positive holes into the light-emitter layer 16. The positive holes and the electrons recombine with each other within the light-emitter layer 16 in the vicinity of the second source/drain electrode 15. Thus, the light emitter generates light.

If the light-emitter layer 16 is made of a material having a high level of transport capacity for positive holes, the gate voltage $V_G$ should be preferably positive, as in FIG. 1(a), and if it is made of a material having a high level of transport capacity for electrons, the gate voltage $V_G$ should be e preferably negative, as in FIG. 1(b).

DISCLOSURE OF THE INVENTION

Problem to be Solved by the Invention

As described earlier, the source-drain voltage applied to the LEFET is higher than those applied to normal FETs so that a carrier whose property is opposite to that of the other carrier supplied from the source electrode is injected from the drain electrode into the light-emitting electrode. However, the emission strength of conventional LEFETs is low because the amount of the carrier injected from the drain electrode is smaller than that of the other carrier injected from the source electrode. Furthermore, the LEFET consumes a large amount of power because it uses a high voltage and also allows a considerable amount of the carrier supplied from the source electrode to be wasted without recombining with the other carrier supplied from the drain electrode. This lowers the emission efficiency.

Thus, the present invention intends to provide a light-emitting transistor capable of emitting an adequately strong ray of light with less power consumption and higher emission efficiency. It also intends to provide a laser light source using the light-emitting transistor.

Means For Solving the Problems

To solve the above-described problem, the light-emitting transistor according to the present invention is characterized in that it includes:

a) a gate electrode covered with an insulating film;

b) a first source/drain electrode provided on the insulating film and made of an electron-injecting material whose work function is equal to or lower than 4.26 electron-volts;

c) a second source/drain electrode provided separately from the first source/drain electrode on the insulating film and made of a hole-injecting material whose work function is higher than 4.26 electron-volts; and d) a light-emitter layer provided on the insulating film between the first source/drain electrode and the second source/drain electrode and made of an organic semiconductor.

The first mode of the laser light source according to the present invention is characterized in that it includes:

a) a gate electrode covered with an insulating film;

b) a first source/drain electrode provided on the insulating film and made of an electron-injecting material whose work function is equal to or lower than 4.26 electron-volts;

c) a second source/drain electrode provided separately from the first source/drain electrode on the insulating film and made of a hole-injecting material whose work function is higher than 4.26 electron-volts;

d) a light-emitter layer provided between the first source/drain electrode and the second source/drain electrode and made of an organic semiconductor; and e) a diffraction grating provided between the first source/drain electrode and the second source/drain electrode in order to diffract light emitted from the light-emitter layer.

The second mode of the laser light source according to the present invention is characterized in that it includes:

a) a gate electrode covered with an insulating film;

b) a comb-shaped first source/drain electrode provided on the insulating film and made of an electron-injecting material whose work function is equal to or lower than 4.26 electron-volts;

c) a second source/drain electrode, consisting of a comb-shaped electrode made of a hole-injecting material whose work function is higher than 4.26 electron-volts, which is provided on the insulating film and arranged so that its comb-teeth engage into the comb-teeth of the aforementioned drain electrode to form a diffraction grading consisting of the two sets of comb-teeth; and d) a light-emitter layer provided between the first source/drain electrode and the second source/drain electrode and made of an organic semiconductor.

The third mode of the laser light source according to the present invention is characterized in that it includes:

a) a gate electrode covered with an insulating film;

b) a first source/drain electrode provided on the insulating film and made of an electron-injecting material whose work function is equal to or lower than 4.26 electron-volts;

c) a second source/drain electrode provided separately from the first source/drain electrode on the insulating film and made of a hole-injecting material whose work function is higher than 4.26 electron-volts;

d) a light-emitter layer provided between the first source/drain electrode and the second source/drain electrode and made of an organic semiconductor; and e) a dielectric multi-layer film provided on an optical path from the light-emitter layer to the outside, which causes an interference of light having a predetermined wavelength within the emission band of the light-emitter layer.

Figure 1:
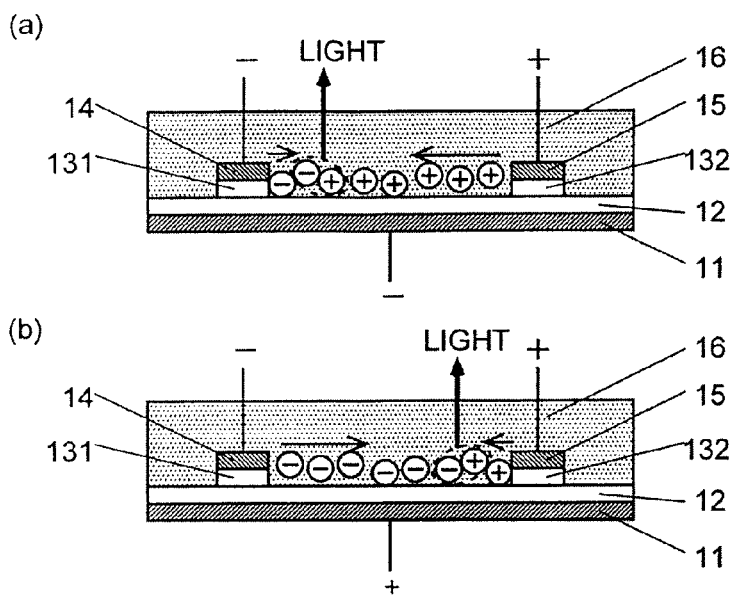
FIG. 1 is a sectional view of an example of conventional light-emitting transistors.

EXPLANATION OF NUMERALS 11, 21, 51, 61, 71 . . . Gate Electrode
12, 22, 52, 62, 72 . . . Insulating Film
131, 132, 23, 53, 63, 73 . . . Adhesive Layer
14 . . . First Source/Drain Electrode
15 . . . Second Source/Drain Electrode
16, 26, 56, 66, 76 . . . Light-Emitter layer
24, 34, 44, 54, 64, 74 . . . Source Electrode
25, 35, 45, 55, 65, 75 . . . Drain Electrode
26a . . . Hole Transport Material
26b . . . Electron Transport Material
271, 272 . . . Resist
281, 282 . . . Mask
311, 312, 41 . . . Thin Aluminum Film Piece
321, 322 . . . Thin Gold Film Piece
42 . . . Coating Layer
641, 642 . . . Teeth of Comb-Shaped Electrode
77 . . . Dielectric Multi-Layer Film

MODES FOR CARRYING OUT THE INVENTION AND THEIR EFFECTS

As explained earlier, the conventional LEFET cannot supply a sufficient number of carriers from the drain electrode into the light-emitter layer. In view of this problem, the present inventors have focused on the work functions of the materials for the first source/drain electrode and the second source/drain electrode. A work function is defined as the difference between the Fermi level of a metal and the vacuum level; a lower value of work function indicates that electrons are easier to be released from the metal to the outside, and a higher value of work function indicates that positive holes are easier to be released.

The following description deals with the case where the second source/drain electrode serves as the source electrode that injects positive holes into the light-emitter layer.

In the present case, the drain electrode (the first source/drain electrode) injects electrons into the light-emitter layer, as described earlier. Making the drain electrode of a material having a low work function leads to an increase in the amount of electrons supplied from the drain electrode into the light-emitter layer and thereby improves both the emission strength and the emission efficiency. The present inventors have experimentally demonstrated that the emission strength and the emission efficiency can be improved by using an electrode with aluminum (work function: 4.06 to 4.26 eV [electron-volts]) covering at least a portion of its surface in place of conventional electrodes made of gold (work function: 5.31 to 5.46 eV). Therefore, it is essential for the present invention to use aluminum or any other material whose work function is equal to or lower than 4.26 eV, i.e. the work function of aluminum, as the material for the drain electrode. In addition to aluminum, examples of such materials include magnesium, calcium, and magnesium-silver alloy.

It is possible to increase the amount of electrons supplied into the light-emitter layer as long as the drain electrode has a minimal contact area between its electron-injecting material and the light-emitter layer. Therefore, it is not always necessary to make the drain electrode with only the electron-injecting material; it is allowable to combine the electron-injecting material with one or more different materials. Examples include: a multi-layer structure made of an electron-injecting material and one or more different materials; and a piece of a certain material coated with an electron-injecting material. It is also possible to use multiple kinds of electron-injecting materials combined.

The source electrode should be made of a material having a high work function so that it can efficiently inject positive holes into the light-emitter layer. For this purpose, a material whose work function is higher than the work function of aluminum, 4.26 eV, is used as the aforementioned material (i.e. the hole-injecting material). Gold electrodes used in conventional LEFETs can be preferably used as the source electrode of the LEFET according to the present invention. Other materials suitable for the hole-injecting material include platinum, indium tin oxide, chromium and nickel. As in the case of the drain electrode, it is possible to make the source electrode with the hole-injecting material combined with one or more different materials.

The following description deals with another case where the first source/drain electrode serves as the source electrode that injects electrons into the light-emitter layer. In this case, making the drain electrode (the second source/drain electrode) of a material having a high work function leads to an increase in the amount of positive holes supplied from the drain electrode into the light-emitter layer and thereby improves both the emission strength and the emission efficiency. In the present case, a hole-injecting material whose work function is higher than 4.26 eV can be used as the material for the drain electrode, and an electron-injecting material whose work function is equal to or lower than 4.26 eV can be used for the source electrode.

As explained thus far, either the source electrode or the drain electrode is made of an electron-injecting material whose work function is equal to or lower than 4.26 eV and the other one is made of a hole-injecting material whose work function is higher than 4.26 eV, irrespective of whether positive holes or electrons are to be injected from the source electrode into the light-emitter layer. This means that the same structure can be used for both cases. Accordingly, in the present invention, one electrode made of an electron-injecting material is called the first source/drain electrode and the other electrode made of a hole-injecting material is called the second source/drain electrode.

Each of the first source/drain electrode and the second source/drain electrode may have the same layered structure in which the electron-injecting material and the hole-injecting material are stacked in the same order. This design allows the two kinds of electrodes to be simultaneously created so that the manufacturing process is simplified. At the first source/drain electrode, the electron-injecting material mainly contributes to the injection of electrons, whereas, at the second source/drain electrode, the hole-injecting material mainly contributes to the injection of positive holes. If the electrodes are to be adhered to the insulating film, the material having a higher degree of adhesion to the insulating film should be located on the bottom side, irrespective of its stacking order.

If the electron-injecting material has a higher degree of adhesion to the insulating film than the hole-injecting material, the second source/drain electrode may consist of an adhesive base layer made of the electron-injecting material and covered with the hole-injecting material. According to this design, both the first source/drain electrode and the second source/drain electrode are securely adhered to the insulating material with the electron-injecting material. Furthermore, this design allows the first source/drain electrode and the adhesive base layer of the second source/drain electrode to be simultaneously created so that the manufacturing process is simplified. Similarly, if the hole-injecting material has a higher degree of adhesion to the insulating film than the electron-injecting material, the first source/drain electrode may consist of an adhesive base layer made of the hole-injecting material and covered with the electron-injecting material.

The gate electrode and the insulating film may be the same as those used in conventional LEFETs. For example, the gate electrode may be made of an n-type silicon doped with more impurities than normal silicon semiconductors in order to lower its resistance, and the surface of the gate electrode may be oxidized to form an oxide film as the insulating film. The organic semiconductor in the light-emitter layer may also be the same as those used in conventional LEFETs, OFETs or OLEDs. For example, a substance suitable for generating orange light is poly(2-methoxy, 5-(2'-ethyl-hexoxy)-1,4-phenylenevinylene) (abbreviated as MEH-PPV), which is represented by the following formula (1):

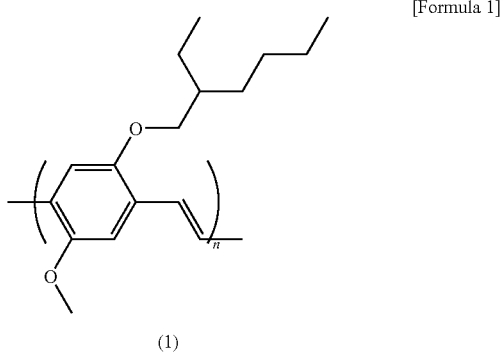

[Formula 1]

(1)

The substances disclosed in Non-Patent Documents 1 and 2, i.e. $(C_6H_5C_2H_4NH_3)_2PbI_4$ and tetracene etc., are also available.

The LEFET according to the present invention operates basically in the same way as conventional LEFETs: To inject positive holes from the source electrode into the light-emitter layer, a voltage should be applied between the source electrode and the drain electrode while a negative gate voltage is applied through the gate electrode. This setting makes positive holes to be injected from the source electrode (the second source/drain electrode) into the light-emitter layer and also makes electrons to be injected from the drain electrode (the first source/drain electrode) into the light-emitter layer. Within the light-emitter layer, the positive holes are transported toward the drain electrode due to the source-drain voltage, being pulled toward the gate electrode due to the gate voltage, and then they recombine with the electrons in the vicinity of the drain electrode. Thus, the light emitter generates light. Turning the gate voltage $V_G$ on/off causes a change in the concentration of positive holes in the vicinity of the insulating film. Thus, it is possible to control the on/off state of the emission.

To inject electrons from the source electrode into the light-emitter layer, a voltage should be applied between the source electrode and the drain electrode while a positive gate voltage is applied through the gate electrode. This setting makes electrons to be injected from the source electrode (the first source/drain electrode) into the light-emitter layer and also makes positive holes to be injected from the drain electrode (the second source/drain electrode) into the light-emitter layer. These positive holes and electrons also recombine with each other to make the light-emitter generate light. The on/off control of the emission is also performed in the same manner.

The drain electrode of the present invention makes the injection of the carrier easier whose polarity is opposite to that of the other carrier that is injected from the source electrode into the light-emitter layer than in conventional LEFETs. Therefore, applying a source-drain voltage that is as low as in a conventional case produces a stronger emission of light than in the conventional case. The same level of emission strength as in a conventional case can be attained at a lower source-drain voltage. An appropriate setting of the source-drain voltage simultaneously yields the above two effects. Furthermore, the emission efficiency improves due to the decrease in the number of those carriers which are injected from the source electrode into the light-emitter layer but do not contribute to the emission of light.

The first source/drain electrode and the second source/drain electrode do not always have to be in contact with the insulating film; for example, it is allowable to insert another light-emitter layer between these electrodes and the insulating film. However, the first source/drain electrode and the second source/drain electrode are preferably in contact with the insulating film in order to help the action of pulling the carriers toward the gate electrode.

The light-emitter layer may be made of two or more kinds of materials. For example, the area of the light-emitter layer that is in contact with the first source/drain electrode may be made of an electron transport material, and the other area that is in contact with the second source/drain electrode may be made of a hole transport material. This construction improves both the transport efficiency of the electrons injected from the first source/drain electrode into the light-emitter layer and that of the positive holes injected from the second source/drain electrode into the light-emitter layer. In this construction, when a negative voltage is applied to the gate electrode, the second source/drain electrodes injects positive holes into the light-emitter layer, which are then transported toward the first source/drain electrode, being pulled toward the gate electrode. Upon reaching the vicinity of the first source/drain electrode where the hole transport material is present, the positive holes recombine with the electrons supplied from the first source/drain electrode and thereby generate light. The electrons supplied from the first source/drain electrode are repelled from the gate electrode due to the presence of negative gate voltage. Therefore, the recombination takes place only within the vicinity of the first source/drain electrode. In contrast, when a positive voltage is applied to the gate electrode, the first source/drain electrode injects electrons into the light-emitter layer, which are then transported toward the second source/drain electrode, being pulled toward the gate electrode. Upon reaching the vicinity of the second source/drain electrode where hole transport material is present, light is generated. If the hole transport material and the electron transport material have different emission wavelengths, the above LEFET emits light of a different wavelength by switching the positive/negative setting of the gate electrode.

The following paragraphs describe the laser light source according to the present invention.

Having the construction described thus far, the LEFET of the present invention is capable of efficiently supplying carriers into the light-emitter layer and increasing the carrier density in the vicinity of the insulating film by applying the gate voltage. Under such a high level of carrier density, it is possible to realize a state of population inversion where the carriers in the exited state exceed in number the carriers in the ground state. The light generated in the state of population inversion can be brought into resonance or interference to obtain a laser emission. This laser emission can be turned on and off by switching the gate voltage on and off. A generally known type of distributed feedback (DFB) laser uses a diffraction grating, and the present invention has applied this DFB structure to the LEFET.

In the first mode of the laser light source, a diffraction grating for producing an interference of light and thereby generating a laser emission is separately provided between the first source/drain electrode and the second source/drain electrode. An example of the diffraction grating can be obtained by forming grid-like projections and recesses on the insulating film. It is also possible to put a separate diffraction grating on the insulating film.

In the second mode of the laser light source, the diffraction grading consists of comb-shaped electrodes, which are used in many types of FETs: The position of the first source/drain electrode and the second source/drain electrode are adjusted so that their comb-teeth engage into each other at equal intervals to constitute the diffraction grating. This design makes it possible to create the laser light source without using an additional member for the diffraction grating.

The third mode of the laser light source has a dielectric multi-layer film located in an optical path in which the light emitted from the light-emitter layer travels to be released to the outside. If the interference wavelength of the dielectric multi-layer film is equal to the emission wavelength of the light-emitter layer, the light generated in the light-emitter layer becomes stronger while it interferes with the dielectric multi-layer film. Thus, a laser oscillation is obtained.

Embodiments

Figure 2:
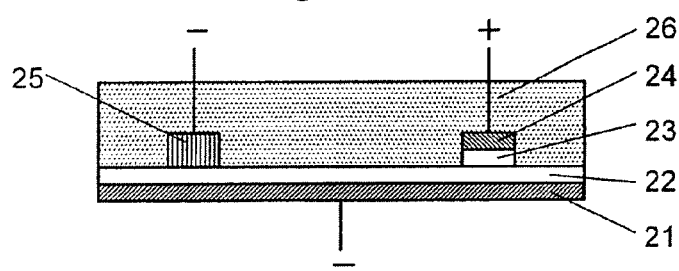
FIG. 2 is a sectional view of the first embodiment of the light-emitting transistor according to the present invention.

The first embodiment of the light-emitting transistor according to the present invention is described with reference to FIG. 2. This embodiment uses a low-resistance n-type silicon substrate as the gate electrode 21. An insulating film 22 consisting of $SiO_2$ oxide film is formed on one side of the substrate. As in conventional LEFETs, a source electrode (second source/drain electrode) 24 made of gold is provided on the insulating film 22 with an adhesive layer 23 made of chromium inserted between them. A drain electrode 25 (first source/drain electrode) made of aluminum is also provided on the insulating film 22, being separated from the drain electrode 24 by a predetermined channel length. Since aluminum has a good adhesion to $SiO_2$, this drain electrode 25 can be directly formed on the insulating film 22. A light-emitter layer 26 made of an organic substance is formed on the insulating film 22 so that it covers the source electrode 24 and the drain electrode 25. The organic substance used in the present embodiment is MEH-PPV, which was mentioned earlier.

Figure 3:
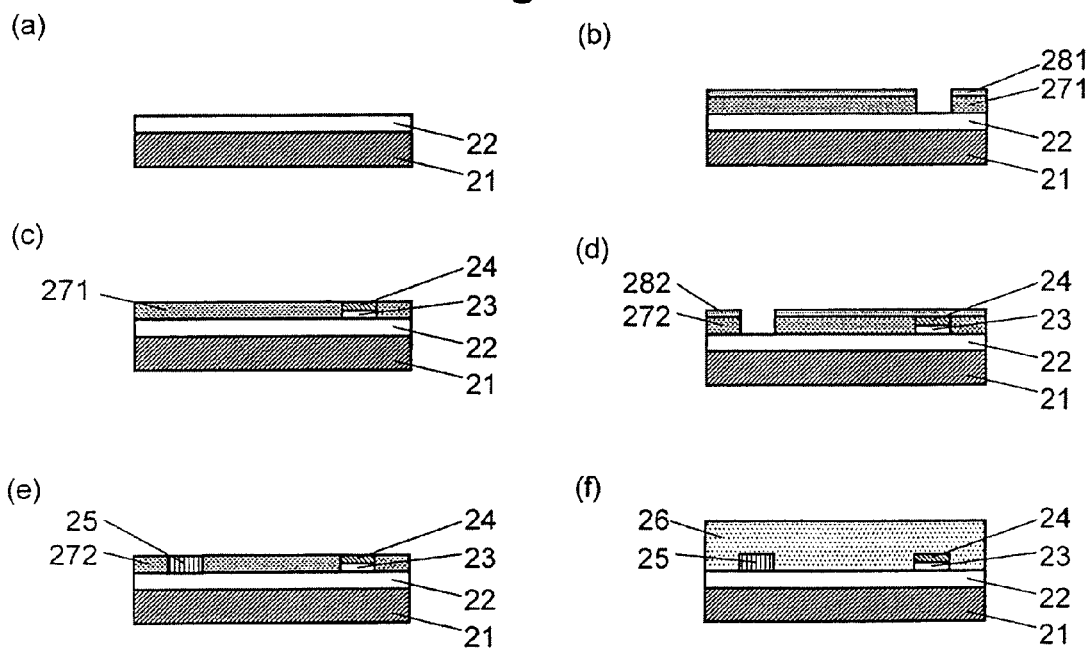
FIG. 3 is an illustration showing a process of manufacturing the light-emitting transistor of the first embodiment.

FIG. 3 illustrates a process of manufacturing the LEFET of the first embodiment.

(a) The low-resistance n-type silicon substrate 21 is heated under an oxygen atmosphere to create the $SiO_2$ oxide film 22 on its surface.

(b) A resist 271 is applied on the $SiO_2$ oxide film 22 by a spin-coating process, on which a mask 281 corresponding to the shape of the source electrode is formed to print the pattern of the source electrode on the resist.

(c) Chromium and gold are deposited in this order to create the adhesive layer 23 and the source electrode 24.

(d) After the resist 271 is removed, a new resist 272 is applied onto the insulating film and the source electrode, on which a mask 282 for the drain electrode is formed to print the pattern of the drain electrode. This mask is provided with a positioning mark to be referenced for creating the pattern of the drain electrode in the predetermined position.

(e) Aluminum is deposited to create the drain electrode 25.

(f) After the resist is removed, the light-emitter layer 26 is formed by a cast process to finish the LEFET of the first embodiment.

The LEFET of the first embodiment operates as follows: A source-drain voltage $V_{SD}$ is applied between the source electrode 24 and the drain electrode 25 while a negative gate voltage $V_G$ is applied to the gate electrode 21. By this setting, positive holes and electrons from the source electrode 24 and the drain electrode 25 are injected into the light-emitter layer 26, respectively. The positive holes and the electrons injected into the light-emitter layer 26 recombine with each other in this layer. Thus, the light-emitter generates light. As in the case of conventional LEFETs, the on/off state of the emission can be controlled by switching the gate voltage $V_G$ on/off. In the LEFET of the present embodiment, the drain electrode 25 is made of aluminum whose work function is lower than that of gold. Therefore, the amount of electrons injected from the drain electrode 25 is larger than in conventional LEFETs and the emission of light is accordingly stronger. The emission efficiency is also improved because the positive holes injected from the source electrode recombine with electrons with higher probability.

Figure 4:
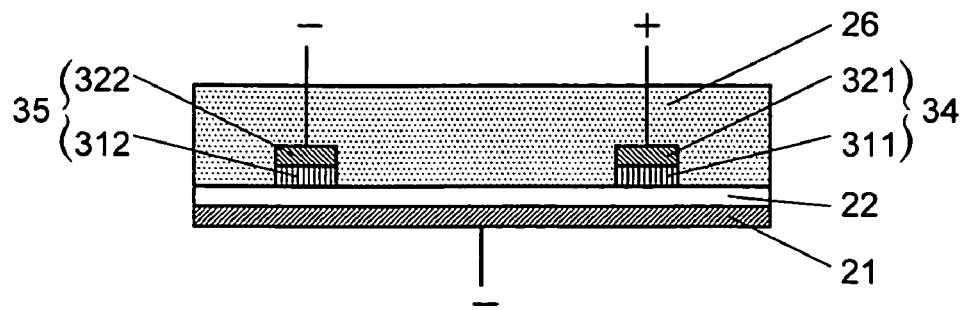
FIG. 4 is a sectional view of the second embodiment of the light-emitting transistor according to the present invention.

The second embodiment of the LEFET according to the present invention is described with reference to FIG. 4. The gate electrode 21 and the insulating film 22 are identical to those used in the first embodiment. On the insulating film 22, a pair of thin aluminum film pieces 311 and 312 are provided, being separated from each other by a predetermined channel length, and thin gold film pieces 321 and 322 are provided on the thin aluminum film pieces 311 and 312, respectively. The combination of the thin aluminum film pieces and the thin gold film pieces function as the source electrode 34 and the drain electrode 35. As explained earlier, aluminum has a good adhesion to the insulating film ($SiO_2$). Therefore, in the present embodiment, there is no need to provide the two electrodes with an adhesive layer. The light-emitter layer 26 is identical to that used in the first embodiment.

Basically, the LEFET of the second embodiment is produced by the same photo-lithography process as used in the first embodiment. In the second embodiment, however, the source electrode and the drain electrode can be simultaneously created by just one round of the resist formation, pattern printing and vapor deposition (where aluminum is followed by gold) because the two electrodes have the same construction. Therefore, the entire production process is shorter than in the first embodiment. Moreover, the source electrode and the drain electrode do not have any positional discrepancy.

The source electrode 24 and the drain electrode 25 have the same construction but different functions. The work function of aluminum is lower than that of gold. Therefore, at the source electrode 24, the thin gold film piece 321 mainly contributes to the injection of positive holes, whereas, at the drain electrode 25, the thin aluminum film piece 312 mainly contributes to the injection of electrons. Except for the function of the electrodes, the LEFET of the second embodiment operates in the same manner as that of the first embodiment.

Figure 5:
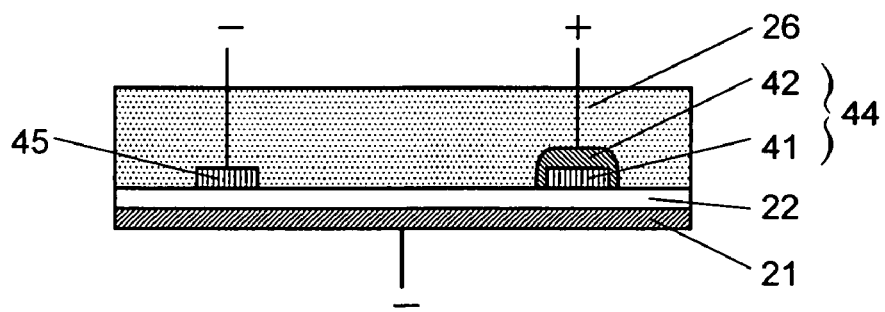
FIG. 5 is a sectional view of the third embodiment of the light-emitting transistor according to the present invention.

The third embodiment of the LEFET according to the present invention is described with reference to FIG. 5. The gate electrode 21 and the insulating film 22 are identical to those used in the first and second embodiments. The source electrode 44 consists of a thin aluminum film piece 41 covered with a coating layer 42 made of gold. The drain electrode 45 is made of aluminum. Both the source electrode 44 and the drain electrode 45 are in contact with the insulating film 22 with their aluminum surfaces and have accordingly good cohesion. In the manufacturing process, the thin aluminum film piece 41 and the drain electrode 45 are simultaneously created. The light-emitter layer 26 is identical to that used in the first and second embodiments.

The operation of the third embodiment of the LEFET is basically the same as those of the first and second embodiments. The gold of the coating layer 42 of the source electrode 44 contributes to the injection of positive holes into the light-emitter layer 26, and the aluminum of the drain electrode 45 contributes to the injection of electrons.

Figure 6:
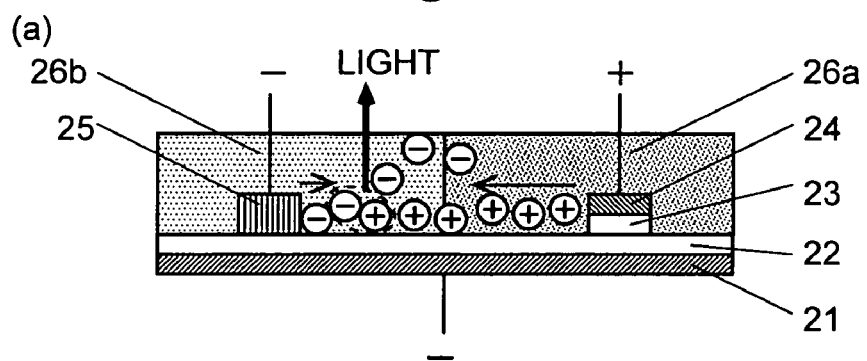
FIG. 6 is a sectional view of the fourth embodiment of the light-emitting transistor according to the present invention.
Figure 6:
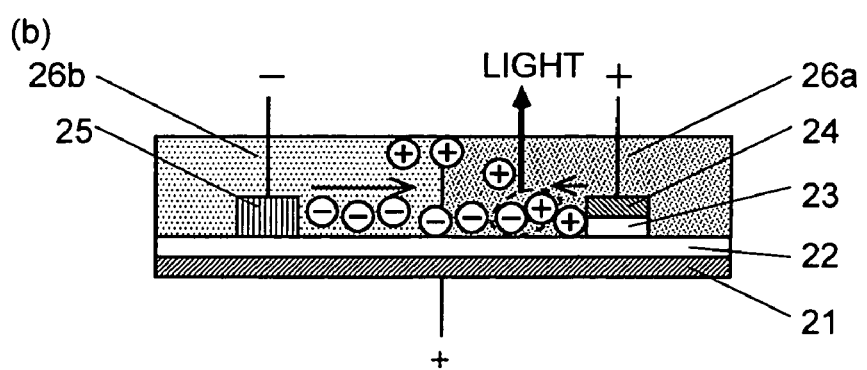

The fourth embodiment of the LEFET according to the present invention is described with reference to FIG. 6. In this embodiment, an area of the light-emitter layer 26 located close to the second source/drain electrode 24 is made of a hole transport material 26a, and the other area of the light-emitter layer 26 located close to the first source/drain electrode 25 is made of an electron transport material 26b. The other elements of the construction are identical to those used in FIG. 2. In the LEFET of the present embodiment, when a source-drain voltage $V_{SD}$ with the positive end at the second source/drain electrode 25 is applied while a negative voltage is applied to the gate electrode, the second source/drain electrode 24 injects positive holes into the light-emitter layer 26, which are then transported toward the first source/drain voltage 25, being pulled toward the gate electrode. Meanwhile, the first source/drain electrode 25 injects electrons into the light-emitter layer 26. Upon reaching the area of the light-emitter layer 26 in the vicinity of the first source/drain electrode 25, the positive holes recombine with the electrons in the electron transport material 26b and thereby generate light (FIG. 6(a)). When a positive voltage is applied to the gate electrode, the first source/drain electrode 25 injects electrons into the light-emitter layer 26. Then, being pulled toward the gate electrode, the electrons are transported toward the second source/drain electrode 24 and recombine with the positive holes in the hole transport layer 26a and generate light (FIG. 6(b)). Thus, depending on the polarity of the gate electrode, the LEFET of the present embodiment emits light from different light-emitting materials (the hole transport layer 26a and the electron transport material 26b). Therefore, the emission wavelength can be controlled with the polarity of the gate electrode.

Figure 7:
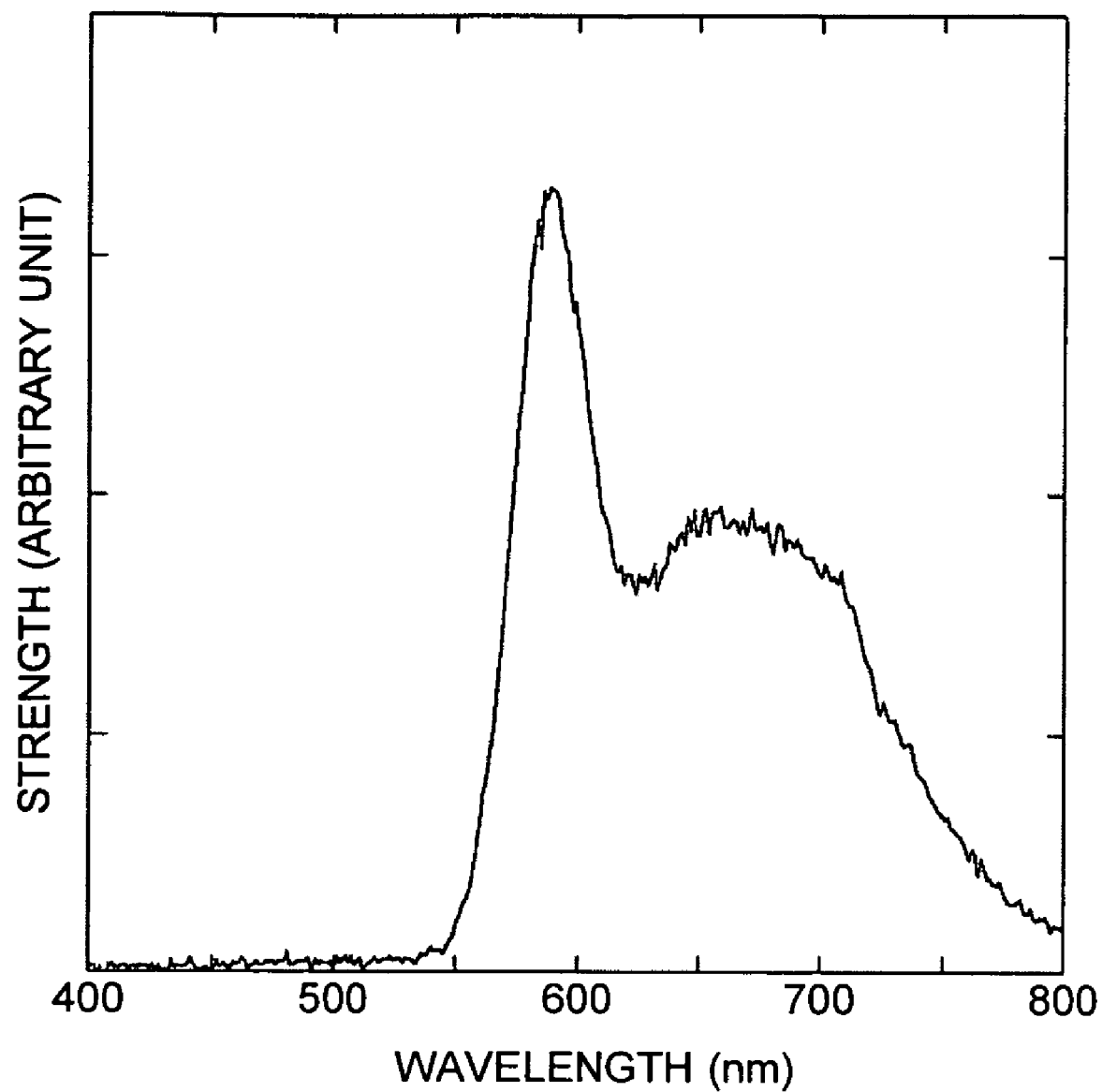
FIG. 7 is a graph showing an emission spectrum of a light-emitting transistor as a comparative example (and of the light-emitting spectrum of the first embodiment).
Figure 8:
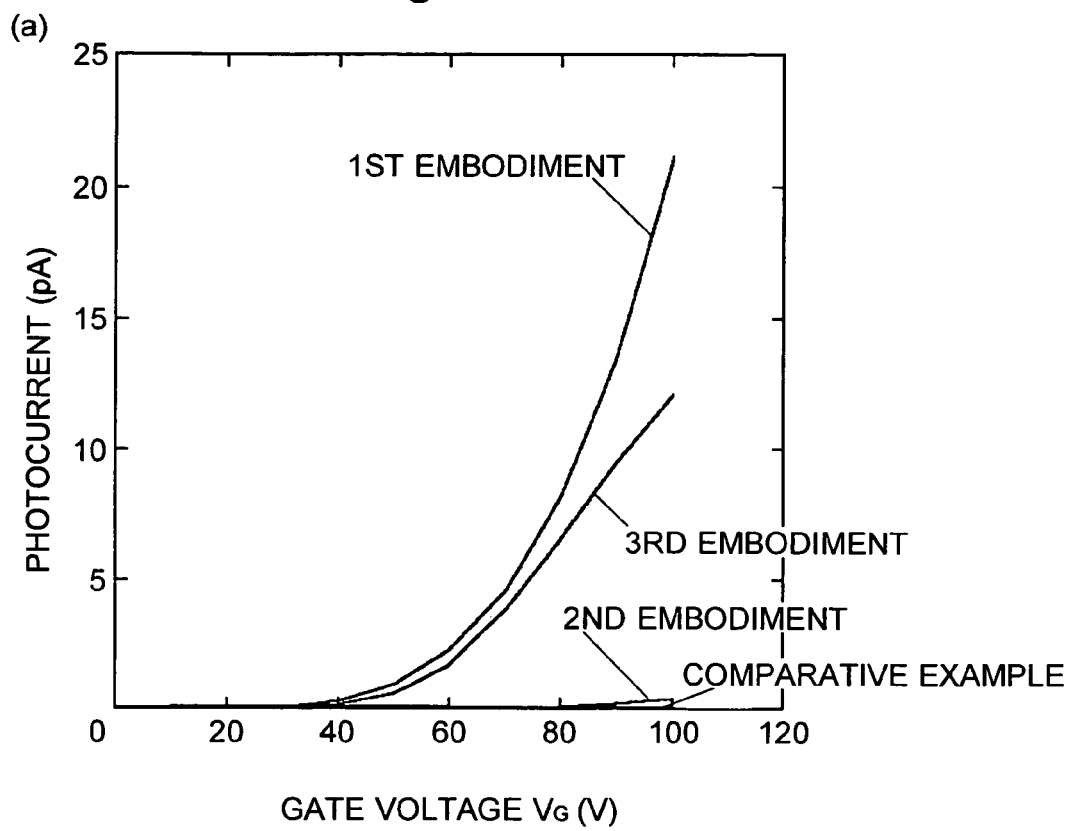
FIG. 8 includes two graphs showing: (a) the relationship between the gate voltage $V_G$ and the photocurrent and (b) the relationship between the source-drain current $I_{SD}$ and the photocurrent in the light-emitting transistor of the first embodiment and the comparative example.
Figure 8:
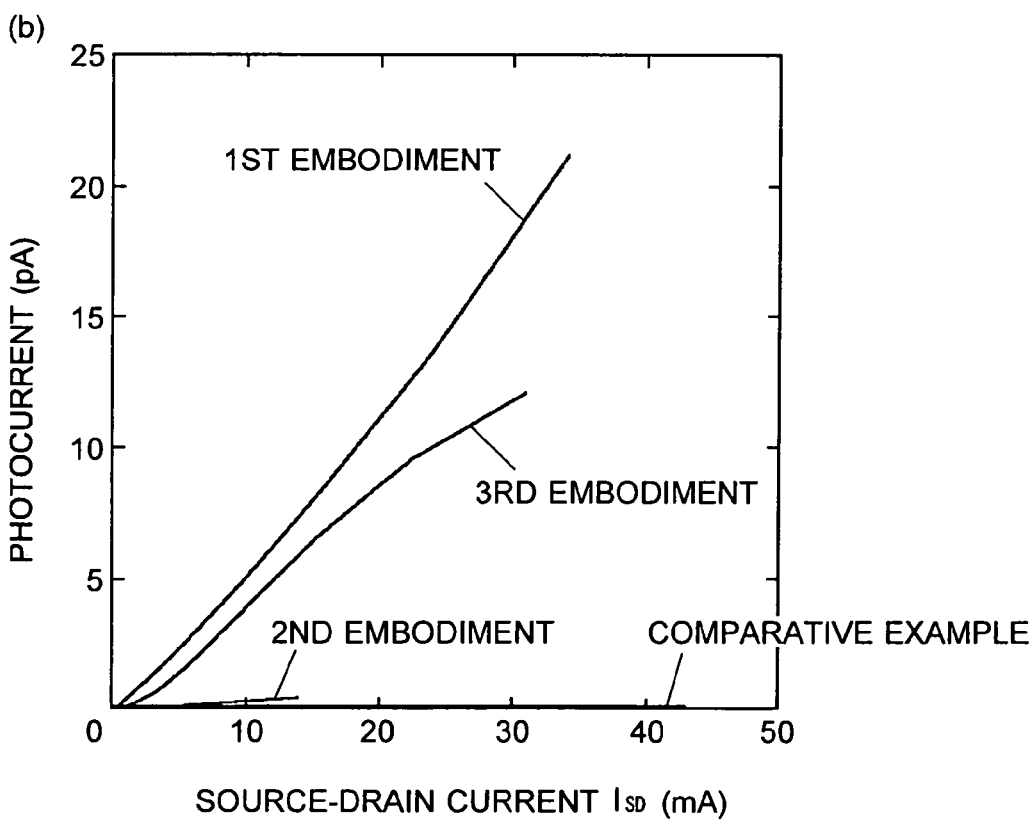

The characteristics of the LEFETs according to the present invention are described with reference to FIGS. 7 and 8. The description hereby shows the results of characteristics measurements performed on the LEFETs of the first through third embodiments and the conventional LEFET (comparative example) shown in FIG. 1. The adhesive layers 131 and 132 in the comparative example are made of chromium. The comparative example was obtained by using chromium instead of aluminum in the second embodiment.

In any of the LEFETs of the first through third embodiments and the comparative example, an emission of orange light was observed. FIG. 7 shows the measurement result of the emission spectrum of the LEFET of the first embodiment. Similar emission spectrums that differ only in strength were obtained with the LEFETs of the second and third embodiments. These emission spectrums have a peak in the vicinity of 590 nanometers in wavelength.

It should be noted that the LEFET of each embodiment significantly differs from the comparative example in emission strength. FIG. 8(a) shows the results of measurements in which the relationship between the gate electrode $V_G$ and the photocurrent was determined for each LEFET with a voltage of −100 volts applied to the drain electrode and the source electrode connected to a ground. The photocurrent, which indicates the emission strength of the LEFET, was measured by the output current of the silicon photodiode, wherein the light from the LEFET was introduced. In the comparative example, the LEFET emitted little or no light within the range of the gate voltage $V_G$ shown in FIG. 7. As opposed to the comparative example, the LEFETs of the first and third embodiments emitted light when the gate voltage $V_G$ was about 40 volts or higher, and it was confirmed that the LEFETs emitted light. The LEFET of the second embodiment emitted light when the gate voltage $V_G$ was about 80 volts or higher.

In any of the first through third embodiments, the photocurrent is zero when $V_G$ is zero. This means that the emission of the LEFET can be turned on and off by switching the gate voltage $V_G$ on and off.

FIG. 8(b) shows the relationship between the photocurrent and the source-drain current $I_{SD}$ observed in the measurements in (a). The LEFETs of the first through third embodiments can emit a stronger ray of light with a lower current $I_{SD}$ and less power consumption than the LEFET of the comparative example.

In the comparative example, the adhesive layer of the drain electrode is in contact with the light-emitter layer, and the work function of chromium used in the adhesive layer is 4.5 eV, which is lower than the work function of gold (but higher than that of aluminum). Therefore, it is probable that the chromium layer contributes to the injection of the electrons. However, the result of the measurement performed on the comparative example shows that the presence of the chromium layer in the drain electrode does not lead to an adequately strong emission of light. This fact suggests that chromium has so high a work function that it cannot be used as the electron-injecting material.

Figure 9:
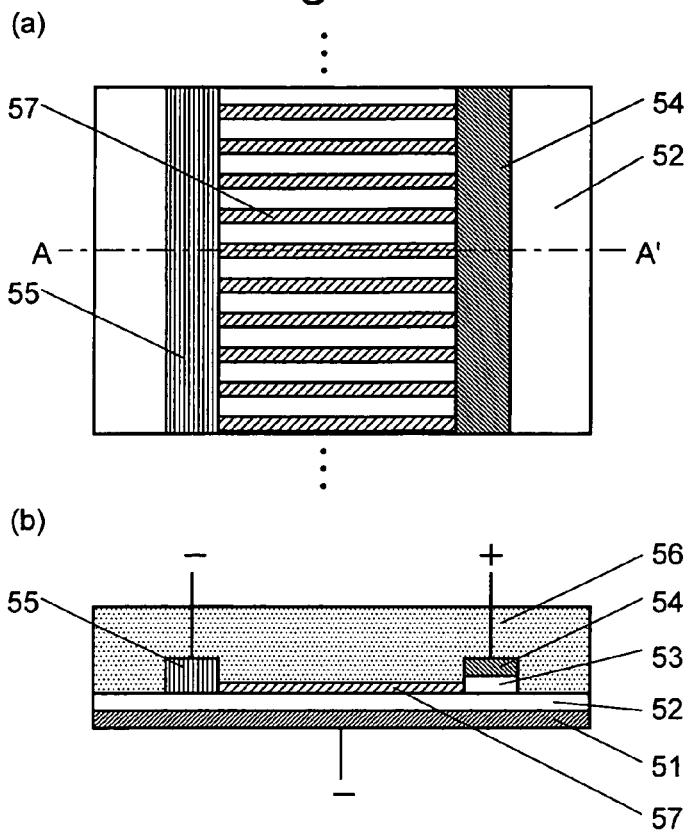
FIG. 9 includes a top view and a sectional view of the first embodiment of the laser light source according to the present invention.

The first embodiment of the laser light source according to the present invention is described with reference to FIG. 9, in which (a) is a top view of the laser light source of the present embodiment (where the light-emitter layer 56 to be described later is omitted), and (b) is a sectional view at line A-A' in (a). An adhesive layer 53, a source electrode 54, a drain electrode 55 and a light-emitter layer 56 are formed on the gate electrode 51 covered with the insulating film 52, as in the first embodiment of the LEFET described earlier. Available as the aforementioned layers are those used in the LEFETs of the second and third embodiments described earlier or in any other LEFET according to the present invention. The source electrode 54 and the drain electrode 55 are formed similar to a pair of bars extending substantially parallel to each other within the plane of the insulating film 52. With the aforementioned layers, a diffraction grating 57 is provided between the source electrode 54 and the drain electrode 55. The diffraction grating 57 consists of a large number of bar-shaped members arranged substantially parallel to each other at equal intervals and perpendicular to both the source electrode 54 and the drain electrode 55 within the plane of the insulating film 52.

Figure 10:
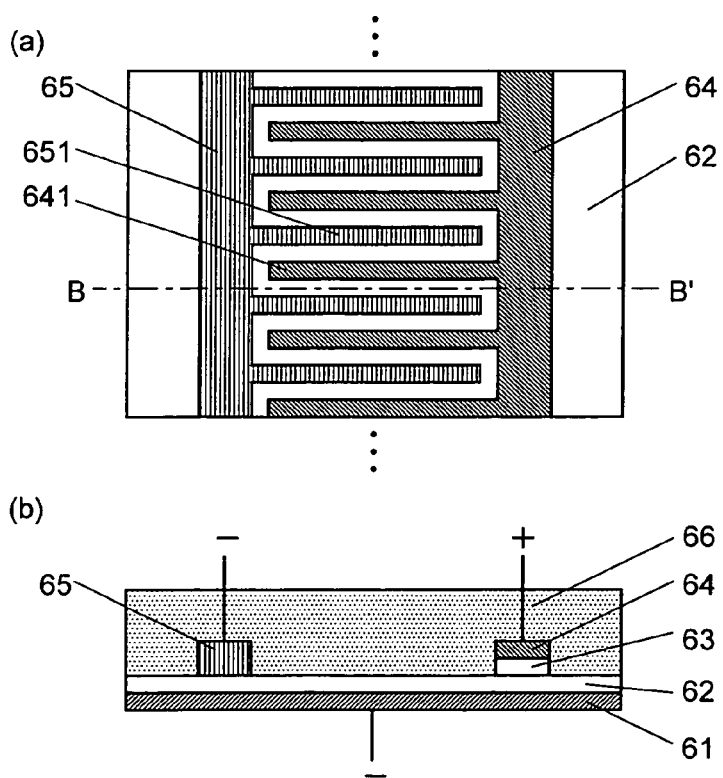
FIG. 10 includes a top view and a sectional view of the second embodiment of the laser light source according to the present invention.

The second embodiment of the laser light source according to the present invention is described with reference to FIG. 10 in which (a) is a top view and (b) is a sectional view at line B-B'. In this embodiment, the gate electrode 61, the insulating film 62, and the light-emitter layer 66 are created by the same process as in the first embodiment. Both the source electrode 64 and the drain electrode 65 are comb-shaped and arranged on the insulating film 66 so that the comb-teeth of one electrode engage into those of the other. The source electrode 64 and the drain electrode 65 are positioned so that their teeth 641 and 642 are arranged at equal intervals. In this construction, the teeth 641 and 651 constitute the diffraction grating. In the present embodiment, an adhesive layer 63 is inserted between the source electrode 64 and the insulating film 62. However, the source electrode 64 and the drain electrode 65 may have different constructions, as in the LEFETs of the second and third embodiments, as long as they are comb-shaped.

Figure 11:
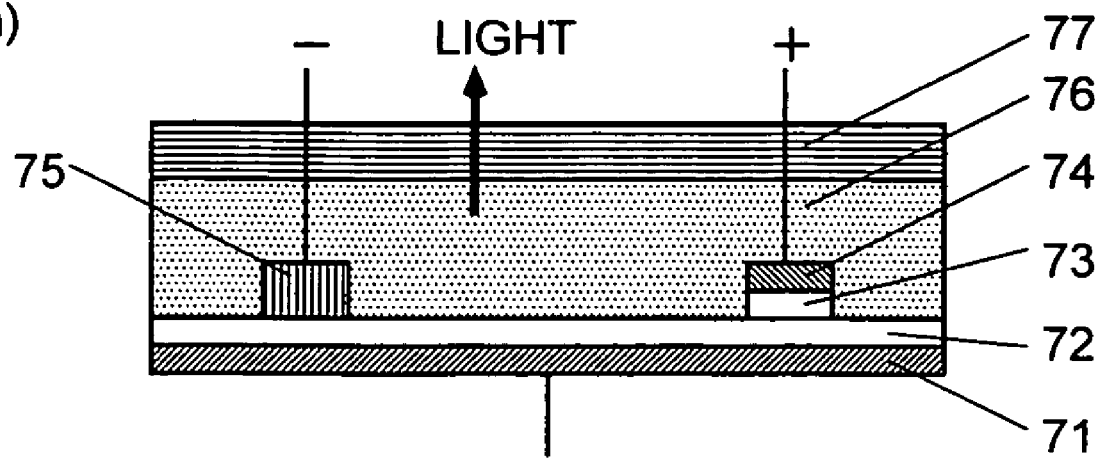
FIG. 11 is a sectional view of the third embodiment of the laser light source according to the present invention.
Figure 11:
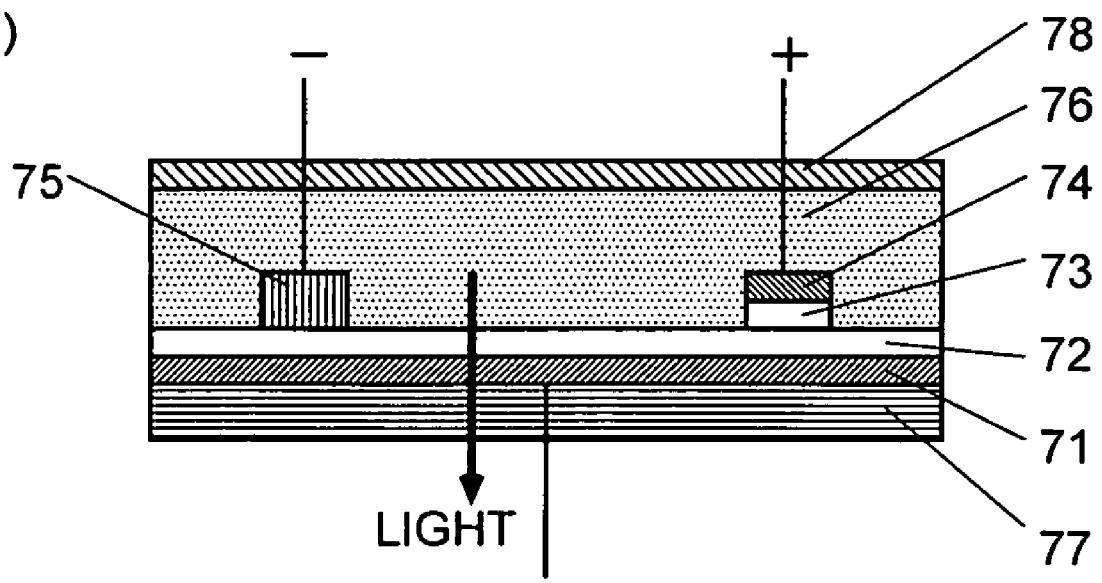

The third embodiment of the laser light source according to the present invention is described with reference to FIG. 11. An adhesive layer 73, a source electrode 74, a drain electrode 75, and a light-emitter layer 76 are formed on the gate electrode 71 covered with the insulating film 72, as in the first embodiment of the LEFET described earlier. A dielectric multi-layer film 77 is provided on the light-emitter layer 76 in FIG. 11(a) or under the gate electrode 71 in FIG. 11(b). The dielectric multi-layer film 77 is designed so that it causes an interference of light whose wavelength equals that of the light emitted from the light-emitter layer 76. If, as in FIG. 11(b), the dielectric multi-layer film 77 is located on the side of the light-emitter layer 76 where the gate electrode 71 is present, the gate electrode 71 and the insulating material 72 should be made of materials that are transparent to the light emitted from the light-emitter layer 76. In this case, a reflector 78 for reflecting the emitted light should be additionally provided on the side of the light-emitter layer 76 opposite to the gate electrode 71. The reflector 78 may be a normal mirror, or it may be a dielectric multi-layer film that causes an interference of light having the aforementioned wavelength and reflects the same light. For the source electrode 74 and the drain electrode 75, the corresponding electrodes used in the LEFETs of the second and third embodiments or in the laser light source of the second embodiment can be used as they are.

This paragraph describes the operation of the laser light sources of the first through third embodiments. The following description focuses on the first embodiment but also applies to the second and third embodiments. When a voltage is applied between the source electrode 54 and the drain electrode 55 while a voltage is applied to the gate electrode 51, light is generated within the light-emitter layer 56 due to the same principle as in the LEFET. In the construction according to the present invention, when the voltage is applied to the gate electrode, the carrier density within the light-emitter layer 56 becomes higher as the position is closer to the insulating film 52, from which the state of population inversion described earlier develops. Under this condition, the diffraction grating 57 (consisting of the teeth 641 and 651 in the second embodiment, or the dielectric multi-layer film 77 in the third embodiment) causes an interference of the emitted light and intensifies the light. Thus, a laser emission is obtained.

The invention claimed is:

1. A light-emitting transistor, comprising:
   a) a gate electrode covered with an insulating film;
   b) a first source/drain electrode provided on the insulating film and made of an electron-injecting material whose work function is equal to or lower than 4.26 electron-volts;
   c) a second source/drain electrode provided separately from the first source/drain electrode on the insulating film and made of a hole-injecting material whose work function is higher than 4.26 electron-volts, the second source/drain electrode including an adhesive base layer made of the electron-injecting material and entirely covered with the hole-injecting material; and
   d) a light-emitter layer provided on the insulating film between the first source/drain electrode and the second source/drain electrode and made of an organic semiconductor.

2. The light-emitting transistor according to claim 1, wherein the electron-injecting material is aluminum, magnesium, calcium, magnesium-silver alloy, or a combination of two or more of these materials.

3. The light-emitting transistor according to claim 1, wherein the hole-injecting material is gold, platinum, indium tin oxide, chromium, nickel or a combination of two or more of these materials.

4. The light-emitting transistor according to claim 1, wherein the light-emitter layer includes a light emitter in which a material of an area that is in contact with the first source/drain electrode is different from that of another area that is in contact with the second source/drain electrode, and the area on the side of the first source/drain electrode is made of an electron transport material and the area on the side of the first source/drain electrode is made of a hole transport material.

5. The light-emitting transistor according to claim 1, wherein the thickness of the insulating film satisfies an interference condition for an emission wavelength of the light emitter layer.

6. A laser light source, comprising;
   a) a gate electrode covered with an insulating film;
   b) first source/drain electrode provided on the insulating film and made of an electron-injecting material whose work function is equal to or lower than 4.26 electron-volts;
   c) a second source/drain electrode provided separately from the first source/drain electrode on the insulating film and made of a hole-injecting material whose work function is higher than 4.26 electron-volts, the second source/drain electrode including an adhesive base layer made of the electron-injecting material and entirely covered with the hole-injecting material;
   d) a light-emitter layer provided between the first source/drain electrode and the second source/drain electrode and made of an organic semiconductor; and
   e) a diffraction grating provided between the first source/drain electrode and the second source/drain electrode in order to diffract light emitted from the light-emitter layer.

7. The laser light source according to claim 6, wherein the diffraction grating is formed on the gate electrode between the first source/drain electrode and the second source/drain electrode.

8. A laser light source, comprising:
   a) a gate electrode covered with an insulating film;
   b) a comb-shaped first source/drain electrode provided on the insulating film and made of an electron-injecting material whose work function is equal to or lower than 4.26 electron-volts;
   c) a second source/drain electrode, consisting of a comb-shaped electrode made of a hole-injecting material whose work function is higher than 4.26 electron-volts, which is provided on the insulating film and arranged so that its comb-teeth engage into the comb-teeth of the aforementioned first source/drain electrode to form a diffraction grating consisting of said two sets of comb-teeth; and
   d) a light-emitter layer provided between the first source/drain electrode and the second source/drain electrode and made of an organic semiconductor.

9. A light-emitting transistor, comprising:
   a) a gate electrode covered with an insulating film;
   b) first source/drain electrode provided on the insulating film and made by stacking a layer of an electron-injecting material whose work function is equal to or lower than 4.26 electron volts and a layer of a hole-injecting material whose work function is higher than 4.26 electron-volts;
   c) a second source/drain electrode provided separately from the first source/drain electrode on the insulating film and made by stacking a layer of the same electron-injecting material and a layer of the same hole-injecting material as the first source/drain electrodes in the same order as the first source/drain electrodes; and
   d) a light-emitter layer provided on the insulating film between the first source/drain electrode and the second source/drain electrode and made of an organic semiconductor.

10. The light-emitting transistor according to claim 9, wherein the electron-injecting material is aluminum, magnesium, calcium, magnesium-silver alloy, or a combination of two or more of these materials.

11. The light-emitting transistor according to claim 9, wherein the hole-injecting material is gold, platinum, indium tin oxide, chromium, nickel or a combination of two or more of these materials.

12. The light-emitting transistor according to claim 9, wherein the light-emitting layer includes a light emitter in which a material of an area that is in contact with the first source/drain electrode is different from that of another area that is in contact with the second source/drain electrode, and the area on the side of the first source/drain electrode is made of an electron transport material and the area on the side of the first source/drain electrode is made of a hole transport material.

13. The light-emitting transistor according to claim 9, wherein the thickness of the insulating film satisfies a condition for an interference condition for an emission wavelength of the light emitter layer.

14. A laser light source, comprising:
a) a gate electrode covered with an insulating film;
b) a first source/drain electrode provided on the insulating film and made of an electron-injecting material whose work function is equal to or lower than 4.26 electron-volts;
c) a second source/drain electrode provided separately from the first source/drain electrode on the insulating film and made of a hole-injecting material whose work function is higher than 4.26 electron-volts; the first source/drain electrode including an adhesive base layer made of the hole-injecting material and entirely covered with the electron-injecting material;
d) a light-emitter layer provided between the first source/drain electrode and the second source/drain electrode and made of an organic semiconductor; and
e) a diffraction grating provided between the first source/drain electrode and the second source/drain electrode in order to diffract light emitted from the light-emitter layer.

15. The laser light source according to claim 14, wherein the diffraction grating is formed on the gate electrode between the first source/drain electrode and the second source/drain electrode.

16. A light-emitting transistor, comprising:
a) a gate electrode covered with an insulating film;
b) a first source/drain electrode provided on the insulating film and made of an electron-injecting material whose work function is equal to or lower than 4.26 electron-volts;
c) a second source/drain electrode provided separately from the first source/drain electrode on the insulating film and made of a hole-injecting material whose work function is higher than 4.26 electron-volts, the first source/drain electrode including an adhesive base layer made of the hole-injecting material and entirely covered with the electron-injecting material; and
d) a light-emitter layer provided on the insulating film between the first source/drain electrode and the second source/drain electrode and made of an organic semiconductor.

17. The light-emitting transistor according to claim 16, wherein the electron-injecting material is aluminum, magnesium, calcium, magnesium-silver alloy, or a combination of two or more of these materials.

18. The light-emitting transistor according to claim 16, wherein the hole-injecting material is gold, platinum, indium tin oxide, chromium, nickel or a combination of two or more of these materials.

19. The light-emitting transistor according to claim 16, wherein the light-emitter layer includes a light emitter in which a material of an area that is in contact with the first source/drain electrode is different from that of another area that is in contact with the second source/drain electrode, and the area on the side of the first source/drain electrode is made of an electron transport material and the area on the side of the first source/drain electrode is made of a hole transport material.

20. The light-emitting transistor according to claim 16, wherein the thickness of the insulating film satisfies an interference condition for an emission wavelength of the light-emitter layer.

* * * * *